(12) United States Patent
RamachandraRao et al.

(10) Patent No.: US 7,005,390 B2
(45) Date of Patent: Feb. 28, 2006

(54) REPLENISHMENT OF SURFACE CARBON AND SURFACE PASSIVATION OF LOW-K POROUS SILICON-BASED DIELECTRIC MATERIALS

(75) Inventors: Vijayakumar S. RamachandraRao, Hillsboro, OR (US); David H. Gracias, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 232 days.

(21) Appl. No.: 10/268,132

(22) Filed: Oct. 9, 2002

(65) Prior Publication Data

US 2004/0072436 A1 Apr. 15, 2004

(51) Int. Cl.
    *H01L 21/31* (2006.01)

(52) U.S. Cl. ............... 438/778; 438/677; 438/788; 438/781; 438/694; 438/692; 257/783; 428/195.1; 428/328; 428/448; 430/311

(58) Field of Classification Search ............ 438/692, 438/782, 696, 699, 778, 637, 780, 636, 789; 428/195.1; 430/314; 423/335; 216/67; 257/783
See application file for complete search history.

(56) References Cited

U.S. PATENT DOCUMENTS

| | | | |
|---|---|---|---|
| 4,778,727 A | * 10/1988 | Tesoro et al. | 428/448 |
| 4,950,583 A | * 8/1990 | Brewer et al. | 430/311 |
| 5,078,091 A | 1/1992 | Stewart | |
| 5,527,621 A | 6/1996 | Matsuura et al. | |
| 5,760,480 A | * 6/1998 | You et al. | 257/783 |
| 6,103,624 A | 8/2000 | Nogami et al. | |
| 6,166,439 A | 12/2000 | Cox | |
| 6,383,466 B1 | 5/2002 | Domansky et al. | |
| 6,455,443 B1 | * 9/2002 | Eckert et al. | 438/781 |
| 6,503,840 B1 | * 1/2003 | Catabay et al. | 438/694 |

(Continued)

OTHER PUBLICATIONS

"Improving Adhesion of Carbon Doped Oxides by Silanization", U.S. Appl. No. 10/209,700, filed Aug. 1, 2002, 35 Pgs.
Britcher, et al., "Direct Spectroscopic Measurements of Adsorption of Siloxane Polymers Onto Glass Fiber Surfaces", Silanes and other Coupling Agents, vol. 2, pp. 99–114, 2000.
Knapp, et al., "Preparation, Comparison and Performance of Hydrophobic AFM Tips", Surface and Interface Analysis 27, pp. 324–331, 1999.
Plueddemann, "Silane Coupling Agents", Intel Corporation, Employee Resource Center, Santa Clara, CA., Copyright 1982, Plenum Press, NY, pp. 73–109, 111–139, 207–232.
"Tailoring Surfaces with Silanes", Chemtech, Dec. 1977, pp. 766–778.

*Primary Examiner*—Matthew Smith
*Assistant Examiner*—Belur V Keshavan
(74) *Attorney, Agent, or Firm*—Blakely, Sokoloff, Taylor & Zafman LLP

(57) ABSTRACT

Processing problems associated with porous low-k dielectric materials are often severe. Exposure of low-k materials to plasma during feature etching, ashing, and priming steps has deleterious consequences. For porous, silicon-based low-k dielectric materials, the plasma depletes a surface organic group, raising the dielectric constant of the material. In the worst case, the damaged dielectric is destroyed during the wet etch removal of the antireflective coating in the via-first copper dual-damascene integration scheme. This issue is addressed by exposing the dielectric to silane coupling agents at various stages of etching and cleaning. Chemical reactions with the silane coupling agent both replenish the dielectric surface organic group and passivate the dielectric surface relative to the surface of the antireflective coating.

17 Claims, 13 Drawing Sheets

U.S. PATENT DOCUMENTS

| | | | |
|---|---|---|---|
| 6,506,675 B1 * | 1/2003 | Oomiya et al. | 438/677 |
| 6,566,283 B1 * | 5/2003 | Pangrle et al. | 438/788 |
| 6,762,127 B1 | 7/2004 | Boiteux et al. | |
| 6,800,940 B1 | 10/2004 | Catabay et al. | |
| 2002/0192600 A1 | 12/2002 | Okamura et al. | |
| 2003/0068489 A1 * | 4/2003 | Ohata | 428/328 |
| 2003/0134495 A1 | 7/2003 | Gates et al. | |
| 2004/0013858 A1 * | 1/2004 | Hacker et al. | 428/195.1 |
| 2004/0018748 A1 * | 1/2004 | Lu et al. | 438/778 |

* cited by examiner

REPLENISHMENT OF SURFACE CARBON AND SURFACE PASSIVATION OF LOW-K POROUS SILICON-BASED DIELECTRIC MATERIALS

FIELD

Embodiments of the invention relate to etching techniques used in semiconductor processing, and more specifically to repairing and passivating "low-k" interlayer dielectric films following plasma-based etching during dual damascene integration of copper interconnects.

BACKGROUND

The semiconductor industry is currently amidst a paradigm shift from aluminum interconnects with silicon dioxide ("$SiO_2$") interlayer dielectrics to copper interconnects with interlayer dielectrics having dielectric constants lower than that of silicon dioxide ("low-k dielectrics"). This change has been mandated by decreasing critical dimensions, as from the current 0.18 micron technology node to state-of-the-art 0.13 micron and smaller technology nodes.

Two of the performance limiting factors of aluminum/silicon dioxide interconnect/dielectric technology are the resistivity of aluminum and dielectric constant of $SiO_2$. As the integrated circuit feature size decreases, the distance between interconnect layers and conducting pathways decreases. Since the capacitance between the interconnects and pathways is inversely proportional to the distance, all else being equal, decreasing feature sizes increases capacitance. Given that an integrated circuit's performance is limited by resistance/capacitance interactions ("RC constant"), capacitive coupling, and power consumption, lowering either the capacitance, resistance, or both permits faster integrated circuit speeds for a given critical dimension.

The switch from aluminum to copper interconnects equates to a 37% decrease in resistivity and improves the RC constant for a given capacitance. However, the switch from $SiO_2$ to lower dielectric constant dielectrics (to decrease the capacitance factor of the RC constant) is not so well defined. There are myriad choices for the dielectric material and deposition process.

An early forerunner in low-k dielectrics was fluorine doped silicon oxide, or fluorosilicate glass ("FSG"). The appeal was that an FSG film could be deposited in the same manner as the undoped film, allowing the use of the same processing techniques and machines. However, the dielectric constant of fluorinated silicon dioxide is not substantially lower (3.3–3.5) than undoped silicon dioxide (3.9–4.2). Further, fluorinated silicon oxide absorbs water and has mechanical properties that may limit its use as a low-k dielectric.

Another popular material is carbon doped oxide, or organosilicate glass ("OSG"). Generally speaking, the OSG films have an $Si_wC_xO_yH_z$ structure wherein the tetravalent silicon has a variety of organic group substitutions. The most common substitution is a methyl ($CH_3$) group provided by an organic precursor gas like trimethylsilane or tetramethlysilane ("3MS" and "4MS" respectively). In OSG the amorphous $SiO_2$ network is sporadically interrupted by the organic group, decreasing the density of the film. Like with FSG, the lower density of OSG compared to undoped $SiO_2$ decreases the dielectric constant. Also like FSG, OSG exhibits certain thermal and mechanical difficulties with current semiconductor processing techniques. Though widely accepted as a low-k dielectric solution, OSG does not offer significantly low dielectric constant values.

FIG. 1 illustrates a cross section of a copper dual-damascene architecture utilizing a low-k interlayer dielectric ("ILD"). A substrate 100 contains any variety of semiconductor devices well known to those skilled in the art as represented rudimentarily by source and drain regions 101, dielectric 120, and gate 121 of a metal oxide semiconductor ("MOS") transistor. Interconnect levels 104, 106, and 108 are representative of, for example, the trench level of a copper dual-damascene interconnect structure, for which via levels 103, 105, and 107 provide electrical contact between interconnect layers and between interconnect layers and semiconductor devices. ILD layers 109 through 114 are formed of low-k dielectric material. The ILDs not only isolate interconnects on different layers, but also isolate interconnects on the same layer. Passivation layer 115 completes the interconnect stack.

FIG. 2a illustrates a cross section of a substrate 200 utilizing a via-first, dual-damascene process. Specifically, FIG. 2a illustrates substrate 200 following via and trench feature etches and prior to an antireflective coating ("ARC") 203 layer removal from the planar surface of an ILD 202 and from within the previously etched via feature. Substrate 200 can be any material onto which an additional interconnect system (dielectric, via, and trench layers) will be added. For example, substrate 200 could be device-containing silicon, or it could be another interconnect system as illustrated by FIG. 1. Etch stop 201 is a deposited material (e.g., silicon nitride, silicon carbide, and silicon oxy nitride) that aids etch selectivity during certain steps of the copper dual-damascene process. Exposure to plasma used to etch the via and trench features has removed surface organic groups of ILD 202 as illustrated by depleted dielectric surface 204. Without surface organic groups, the dielectric constant of ILD 202 is greater than that of the pristine ILD 202 material. The depleted dielectric surface 204 is unprotected against fluoride-based aqueous chemistries to which it may be exposed during subsequent processing steps.

FIG. 2b illustrates substrate 200 of FIG. 2 following the wet etch step to remove ARC 203 layer from both the surface of ILD 202 and from within the previously etched via feature. Fluoride-based aqueous chemistries during the wet etch of ARC 203 and subsequent cleaning steps have further damaged the surface of ILD 202. As noted with reference to FIG. 2a, the plasma used to etch the via and trench features has removed ILD 202 surface organic groups, making the resulting unprotected, hydrophilic surface of ILD 202 more vulnerable to attack by the wet etch chemistries. Between the damage caused by the via and trench plasma etches (specifically the removal of the surface organic groups) and the ARC 203 wet etch, ILD 202 has been rendered useless for both physical and chemical reasons as illustrated by damaged dielectric surface 205. Not only has the dielectric constant of ILD 202 increased, but the critical dimension (the smallest separation of layers, features, etc. tolerable for functional devices, shown as the ILD 202 thickness separating two trench features) has also been compromised as illustrated by threatened critical dimension 206.

DETAILED DESCRIPTION

Figure 1:
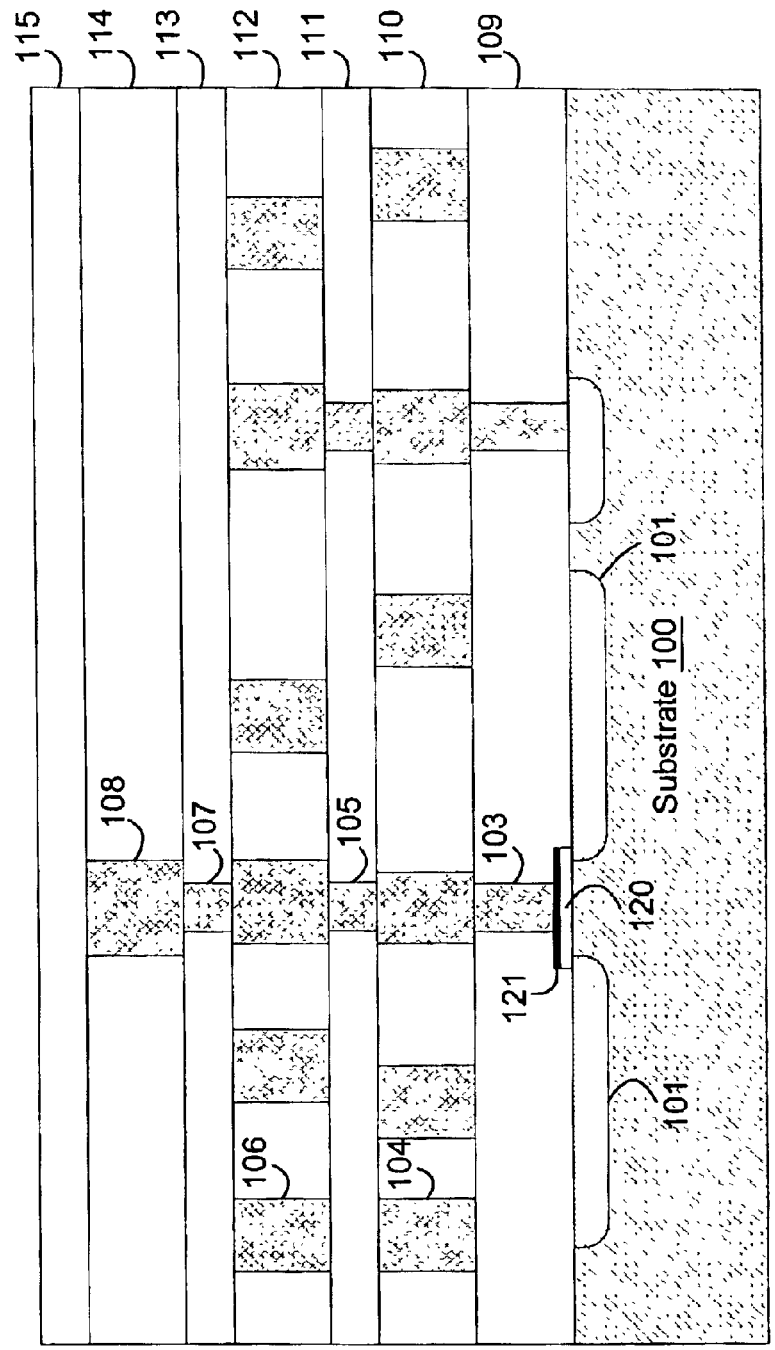
FIG. 1: illustration of prior art substrate cross-section showing a low-k dielectric layer in via and trench levels of a copper dual-damascene architecture.
Figure 2A:
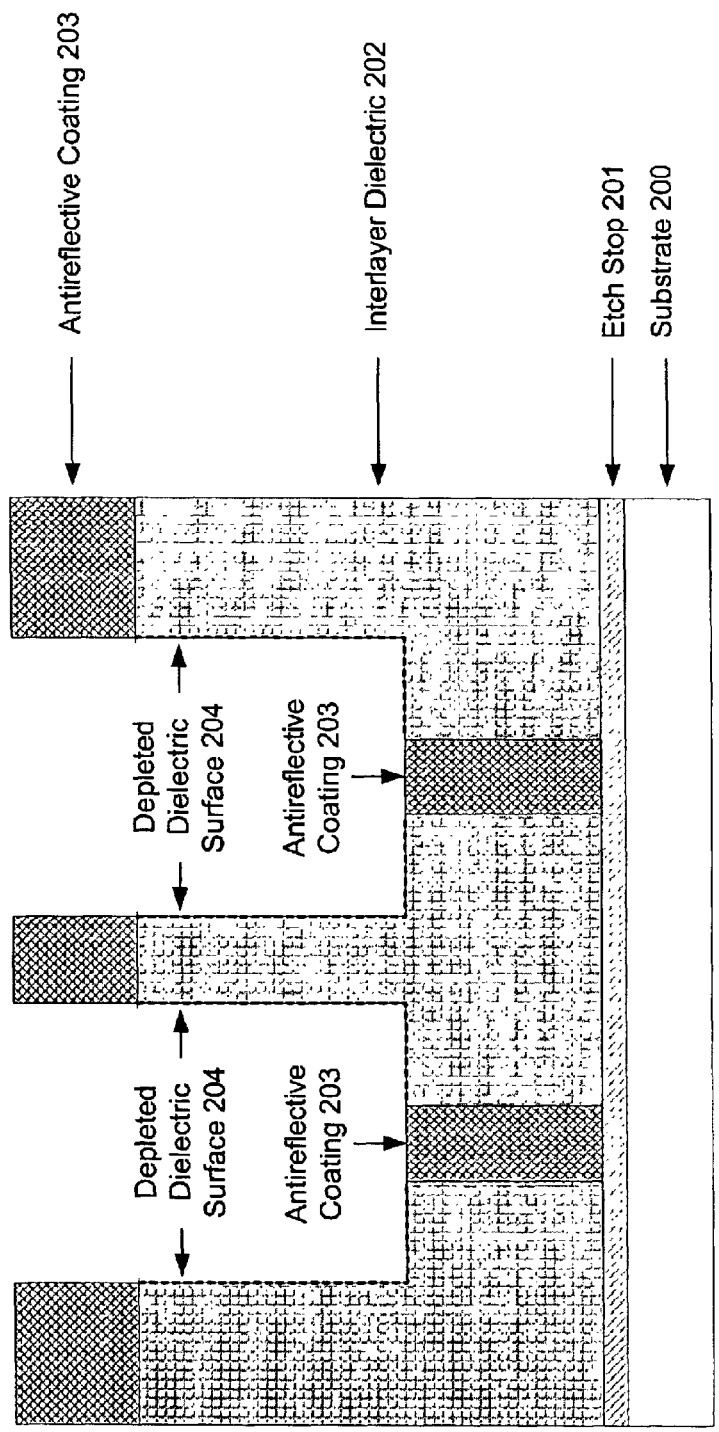
FIGS. 2a and 2b: illustrations of prior art substrate cross-section following the trench etch and following the anti-reflective coating removal showing a damaged interlayer dielectric and threatened critical dimension in a via-first copper dual-damascene process.
Figure 2B:
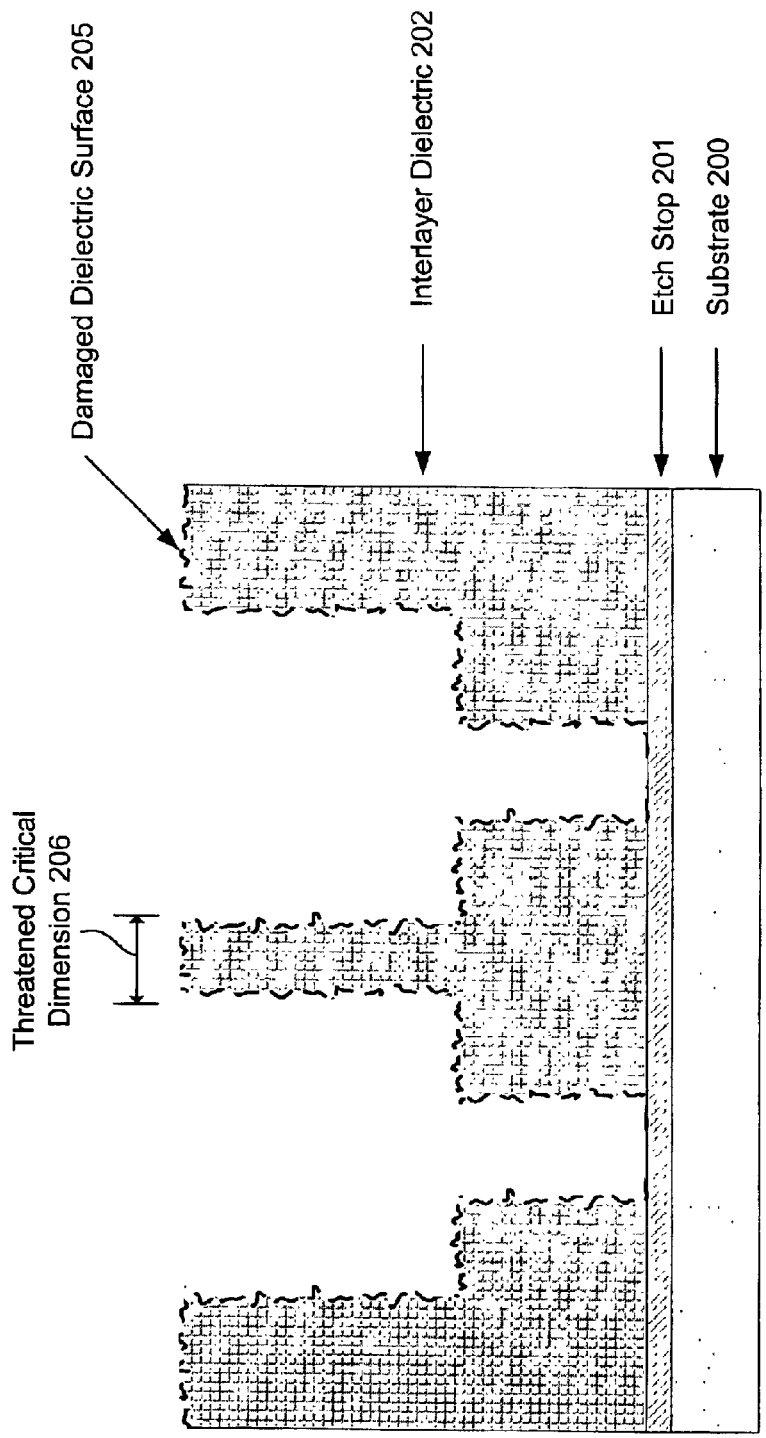

Embodiments of a method for replenishing surface carbon and surface passivation of low-k, porous, silicon-based dielectric materials is described. Reference will now be made in detail to a description of these embodiments as illustrated in the drawings. While the embodiments will be described in connection with these drawings, there is no intent to limit them to drawings disclosed therein. On the contrary, the intent is to cover all alternatives, modifications, and equivalents within the spirit and scope of the described embodiments as defined by the accompanying claims.

Many natural interfaces between dissimilar materials involve at least one material that contains silicon. In the realm of semiconductor manufacture, almost all material interfaces involve either coincidental or purposeful contact between silicon containing materials. Due to both the omnipresence of siliceous interfaces in nature, and the specific importance of siliceous interfaces in semiconductor technology, significant industrial import attaches to any corresponding chemistry and chemical know-how.

Briefly, an embodiment of the invention is a method for chemically repairing and passivating surfaces of low-k interlayer dielectric materials following certain steps of semiconductor manufacture. By exposing ILD surfaces damaged by plasma to a silane coupling agent, the damaged ILD surface can be chemically repaired. The repaired ILD surface further becomes protected from subsequent processing steps. The embodiment helps bring semiconductor processing technology in line with the current state of low-k dielectric material development. For example, many existing porous, silicon-containing materials exhibit favorably low dielectric constants. However, the materials are often incompatible with various manufacturing steps for precisely the same physical and chemical arrangements that enable the materials to be low-k. The embodiment helps transform the theory of a copper/low-k dielectric process to reality by improving the characteristics of the low-k dielectric material at its interface with surrounding materials and manufacturing environments.

FIGS. 3 through 10 illustrate, in detail, an embodiment of the invention as applied to a via-first, copper dual-damascene process. Though the figures represent various processing steps of an embodiment, for the sake of simplicity, they do not display every process step. One skilled in the art will recognize where illustrations of steps have been omitted, and will understand how and when the detailed steps fit into the overall manufacturing process. One skilled in the art will also appreciate that for clarity certain layers are disproportionately illustrated in the figures.

As generally illustrated by FIG. 1 and specifically illustrated by FIGS. 3 through 10, a dual-damascene architecture is a interconnect system utilizing multiple layers of interconnects with multiple layers of vias providing electrical contact between adjacent copper interconnect layers. Dual-damascene further refers to a process by which deposited metal is not etched; instead, the metal is deposited in features etched in dielectric layers, after which the excess metal is removed (and entire wafer surface planarized) using chemical mechanical polishing ("CMP"). Stated differently, both the metal interconnect lines and vias are deposited without an intervening metal etch step. This allows the use of metals, such as copper, that are not readily etched. Via-first refers to the order in which the trench and via features are etched. For via-first, the via feature is etched through the entire thickness of the ILD before the trench feature is etched through a portion of the ILD thickness. Conversely, for trench-first, the trench feature is etched partially through the thickness of the ILD before the via feature is etched through the remaining ILD thickness at the base of the trench feature.

An embodiment of the invention focuses on the interface between porous, low-k, silicon based dielectric materials with adjacent materials and environments (e.g., ILD 302 and its compatibility with wet etch chemicals) faced by the low-k dielectric material during various processing steps. Though an embodiment will be discussed with reference to a via-first, copper dual-damascene process flow, one skilled in the art will appreciate that other process flows (e.g., trench-first copper dual-damascene, or self-aligned variants thereof as described above) can benefit from the invention.

Additionally, though an embodiment will further be discussed with reference to specific materials and chemical compounds, one skilled in the art will realize that the artistry of the invention is also a novel approach to combining materials and processes more than simply utilizing materials themselves.

Figure 3:
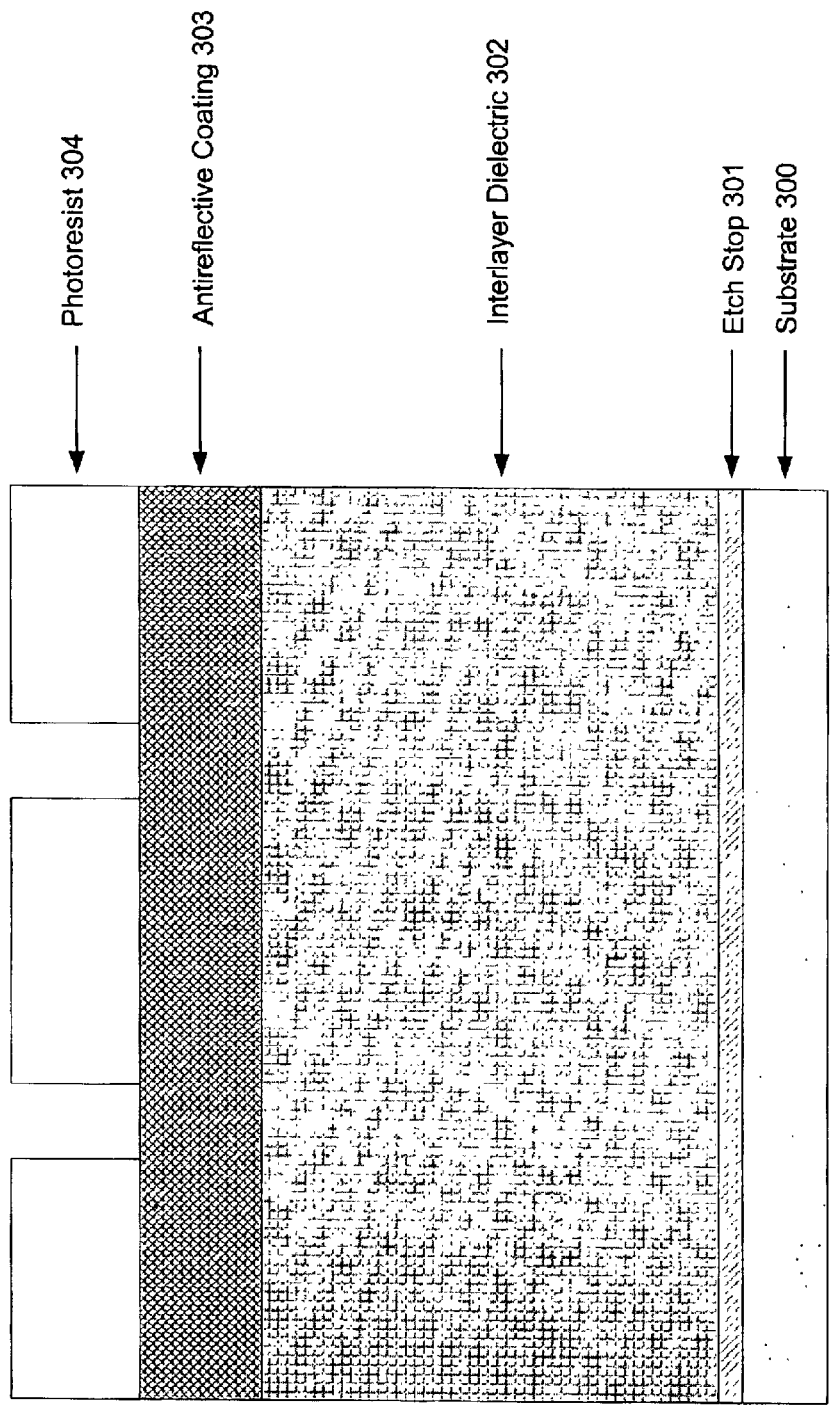
FIG. 3: illustration of substrate cross section following photoresist patterning in preparation for the via etch in a via-first copper dual-damascene process.

FIG. 3 illustrates a cross section of a substrate 300 utilizing a via-first, copper dual-damascene process following an etch stop 301 deposition, an ILD 302 deposition, an ARC 303 deposition, and a photoresist 304 deposition and patterning. The photoresist 304 has been patterned using standard photolithographic patterning processes as is well known in the art. Substrate 300 can be any material onto which an additional interconnect system (via, trench, and dielectric layers) will be added. For example, substrate 300 could be device-containing silicon, or it could be another interconnect system as illustrated by the interconnect layer stack of FIG. 1. Etch stop 301 is a deposited material (e.g., silicon nitride, silicon carbide, and silicon oxy nitride) that aids etch selectivity during certain steps of the copper dual-damascene process. Though illustrated in FIG. 3, an ARC 303 layer may be omitted in an embodiment of the invention depending on the requirements of the via feature etch. The ILD 302 layer will be detailed as an embodiment of the invention relies on the specific chemistry the ILD 302 layer material.

In an embodiment, ILD 302 has a low dielectric constant. The low-k nature of the ILD 302 material allows a fuller utilization of low-resistance copper interconnect lines and smaller critical dimensions by possessing a lower RC constant between adjacent trenches, vias, and layers for a given smaller critical dimension. In other words, for a given critical dimension, the combination of copper and a low-k ILD 302 enhances the performance of the myriad devices that in combination form an expansive number of semiconductor products.

An ideal ILD 302 would have a dielectric constant less than 3.0. It would further be compatible with current processing flows without requiring additional dedicated tools and process steps (e.g., anneals that would disturb devices, ex situ steps for which the wafers would be externally transferred from one machine to another, etc.). Mechanically speaking, the dielectric film would adhere properly to adjacent layers, not be prone to cracking, and have bulk modulus properties compatible with the rigors of manufacture. The film would finally exhibit thermal and chemical properties compatible with existing process flows. Unfortunately, some selections for dielectric materials exhibit favorable electrical properties at the expense of chemical and mechanical properties. Many standard processing steps currently used in production degrade or destroy low-k dielectrics (specifically porous, low-k dielectrics) rendering them practically useless despite their theoretical promise.

As mentioned, there are a variety of materials available that can potentially serve as ILD 302. Certain materials such as carbon doped oxides rely on decreased density of their amorphous molecular networks and less polar Si—C linkages to achieve lower dielectric constants. Other materials also incorporate voids or pores in their structure where the voids and pores not only represent molecular network interruptions, but also represent localized absences of material. Such porous materials are often called "nanofoams." The porosity of the material offers significant improvement in dielectric constant; however, integrating such materials in conventional processing steps is more challenging.

Although a variety of organic and inorganic materials demonstrate desirable dielectric properties, most nevertheless fail other processing or mechanical requirements. Common film problems associated with FSG, OSG, and organic nanofoam compounds include poor adhesion, cracking, via poisoning/contamination, chemical incompatibility, and bulk modulus mismatches that cause device breakage during wirebonding or packaging.

Examples of devastating process steps include etches to create the via and trench features in a copper dual-damascene architecture. Another example of a devastating process step is a selective wet etch between adjacent silicon containing layers (e.g., a silicon-based ILD 302 and a silicon-based ARC 303 or ARC 601 utilized for improving via and trench photolithographic patterning characteristics). Given the high aspect ratios (as high as 5:1 depth:width) and small critical dimensions of current and future etched features, any interlayer dielectric degradation could result in catastrophic critical dimension "blow-ups" or failures. Leading edge implementation of low-k ILD 302 may include the selection of the proper dielectric material and adoption of processing techniques that are compatible with the material.

Another critical aspect of using a low-k ILD 302 is the dielectric material's susceptibility to damage during etching, ashing, and priming processing steps. The ashing and priming steps expose photoresist and antireflective coating material, respectively, to plasma to prepare each for solvent and/or wet etch removal. During each step the dielectric material is exposed to damaging techniques. Some approaches to producing a commercially viable low-k dielectric materials have focused on non-porous, organic, silicon-containing, or siloxane-based, material ("sILD"). During oxygen-containing and oxygen-free plasma etches, ashing, and priming, common to creating the via and trench etches of a copper dual-damascene architecture, the plasma oxidizes and removes the sILD surface carbon. What remains is an $SiO_2$-type surface, with a higher dielectric constant than the pristine sILD, that is readily attacked by fluoride ions during subsequent wet etch and cleaning steps.

In an embodiment, ILD 302 is a porous, silicon-containing material. Porous ILD 302 materials, including those based on hydrosilesquioxane ("HSQ") and methylsilesquioxane ("MSQ"), can have porosities as high as 40%. Such porosity enables the materials to have desirably low dielectric constants, but also exacerbates the processing problems described with reference to the non-porous sILD materials. Whereas the methyl or organic groups of the non-porous sILD material aggregate at the sILD surface, and establish a hydrophobic barrier, the lower bulk organic content of the porous ILD 302 materials reduces such an effect. Furthermore, while the non-porous sILD material can perhaps withstand a fluoride-containing wet etch (even after its surface organic groups have been oxidized and removed), a porous ILD 302 material cannot. Given its porosity and lower bulk organic content, a porous ILD 302 exposes a greater area of unprotected (e.g., hydrophilic) surface to the attacking fluoride ions than the non-porous sILD.

An embodiment of the invention replenishes carbon on the surface of the porous ILD 302 material to both restore the material's low dielectric constant and passivate the surface, thereby creating a coating to withstand exposure to wet etch chemistries. One way to supply carbon to a hydrophilic surface is by chemical reaction with silane coupling agents like organochloro- or organoalkoxy-silanes. The reactions can occur within various environmental conditions, and through exposure to both liquid and vapor phases of the silane coupling agent. Silane coupling agents that may be used include but are not limited to disilazane, trichlorosilane, trimethoxy silane, triethoxy silane, silanol, siloxane, disiloxane, n-dodecyltrichlorosilane, and octyltrichlorosilane. In an embodiment, given the requirements of producing a non-polar and highly hydrophobic coating on porous ILD 302, the silane coupling agent is hexamethyldisilazane ("HMDS" or $(CH_3)_3SiNHSi(CH_3)_3$). In another embodiment, given requirements of producing a polar and hydrophilic coating, the silane coupling agent is 3-aminopropyltriethoxysilane ($C_9H_{23}NO_3Si$).

Making the surfaces of the porous ILD 302 hydrophobic, however, is only a partial solution. During certain processing steps, the entire exposed surface is ILD 302. During other steps, multiple materials are exposed. Particularly, as will be discussed with reference to FIG. 7, following the trench etch in a via-first, copper dual-damascene architecture, the ARC 601 and ILD 302 surfaces are both exposed. The ARC 601 material both on the planar surface of ILD 302 and filling the etched via feature must be selectively removed without damaging the ILD 302 through which the via and trench are etched. Replenishing and passivating the ILD 302 surface is useful if the ARC 601 surface is not passivated, such that during ARC 601 removal the wet etch chemistries readily attack the non-passivated ARC 601 surface while leaving the hydrophobic ILD 302 surface intact. The wet etch selectivity in turn depends on replenishment and passivation selectivity.

Though passivation may be discussed in absolute terms (e.g., "complete" passivation) and surfaces described as having a hydrophobic or hydrophilic coating, it should be understood that each denotation refers to a range of surface energies for which the relative difference in surface energy between two distinct surfaces or materials is sufficient to enable material selective etching.

Figure 4:
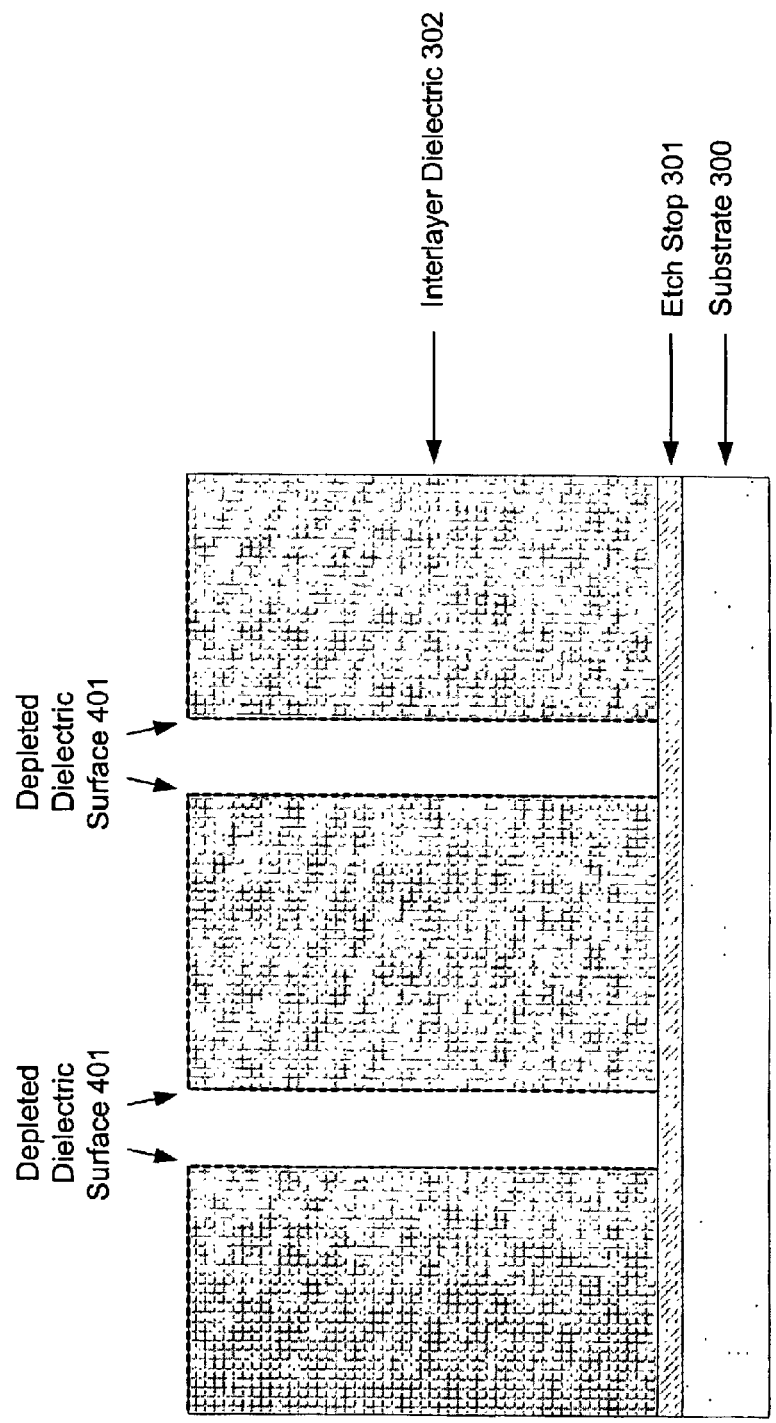
FIG. 4: illustration of substrate cross-section following the via etch, photoresist removal, and subsequent cleans in a via-first copper dual-damascene process.

FIG. 4 illustrates a cross section of a substrate 300 utilizing a via-first, copper dual-damascene process following the processes illustrated by FIG. 3 and after the via feature etch. The plasma used to etch the via feature (and to ash photoresist 304 and prime ARC 303, if present, of FIG. 3) has removed the surface organic groups of ILD 302, as illustrated by a depleted dielectric surface 401, adversely increasing the dielectric constant of ILD 302. In an embodiment, the surface organic group is carbon.

Figure 5:
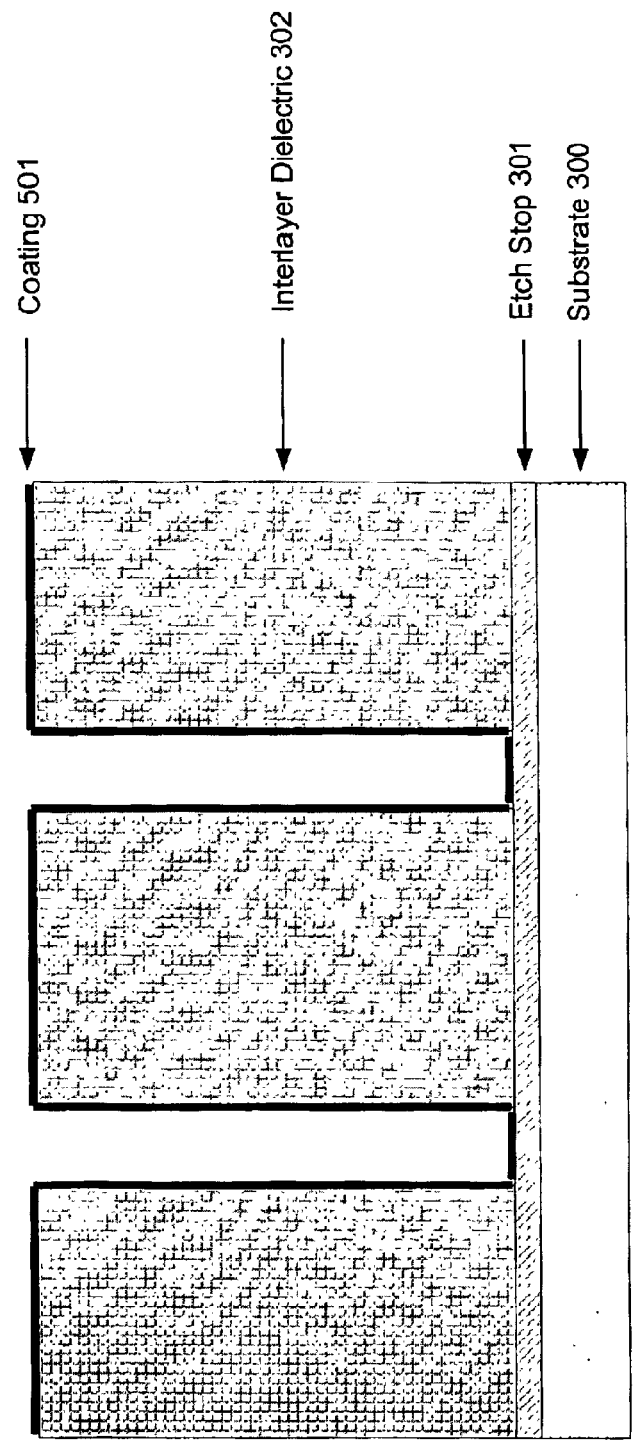
FIG. 5: illustration of substrate cross-section following the repair and passivation of the low-k interlayer dielectric exposed during the via etch by surface organic group replenishment.

FIG. 5 illustrates a cross section of substrate 300 utilizing a via-first, copper dual-damascene process following the processes illustrated by FIG. 4 and after the surface organic group replenishment and passivation of an embodiment of the invention. A coating 501, or the replenished and passivated surface of the ILD 302, is an embodiment of the invention for which there are two distinct results. The first result is that the ILD 302's surface organic groups have been replenished, lowering the dielectric constant to a value approaching the dielectric constant of pristine ILD 302 material. The second result is ILD 302 surface passivation tuned to alter the surface energy, or wetting characteristic, of exposed ILD 302 to make the surface hydrophobic. As will become clear with discussion of additional figures, the coating 501 of exposed ILD 302 protects ILD 302 from the aqueous chemistries associated with subsequent wet etch processing steps. Furthermore, depending on the choice of etch stop 301 material, the coating 501 will also form on the surface of the exposed etch stop 301 at the base of the via feature.

Figure 6:
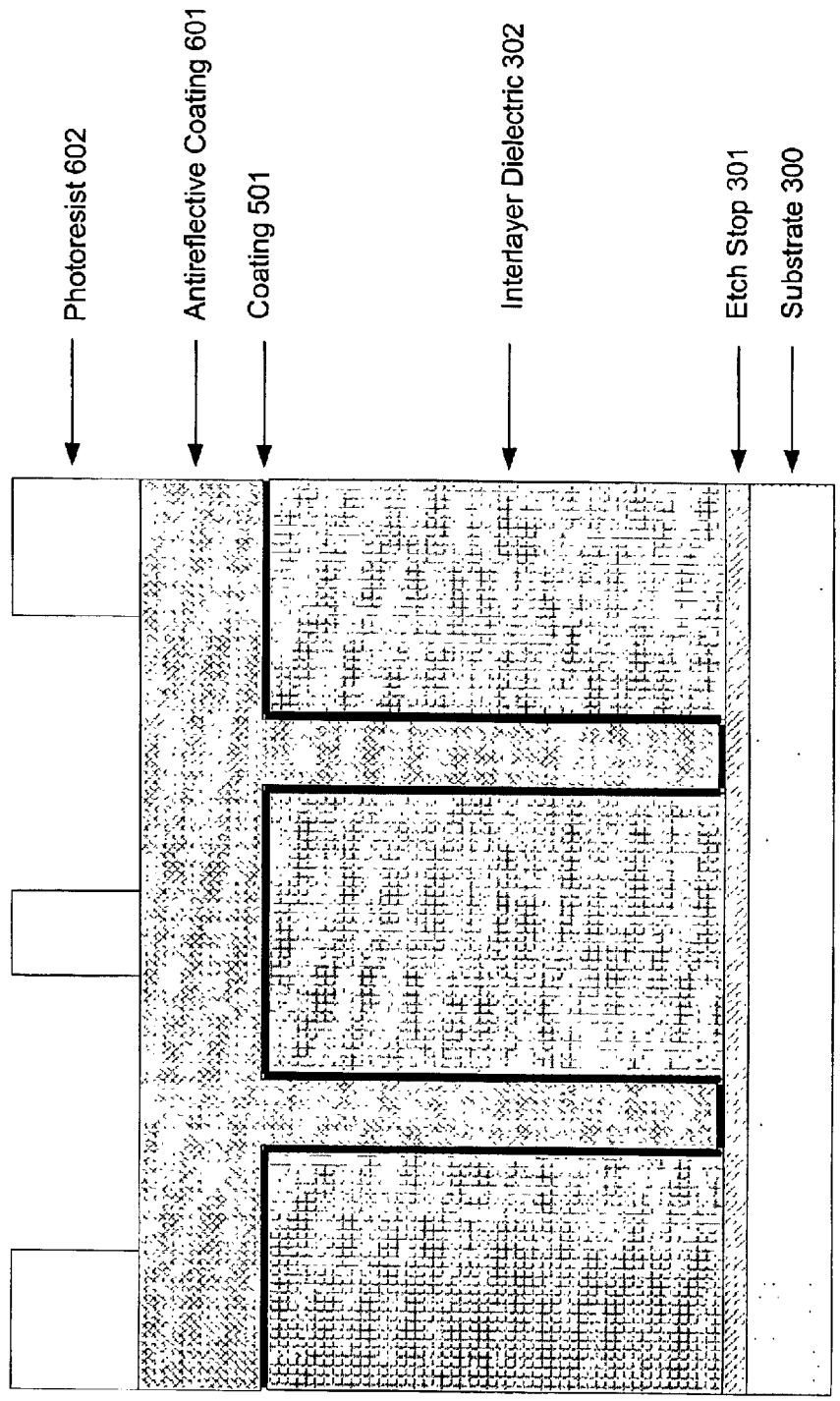
FIG. 6: illustration of substrate cross-section following deposition of an anti-reflective coating and photoresist patterning in preparation for the trench etch.

FIG. 6 illustrates a cross section of substrate 300 utilizing a via-first, copper dual-damascene process following the processes illustrated by FIG. 5 and after the deposition of an ARC 601 layer and a photoresist 602 layer. The additions of ARC 601 layer and photoresist 602 layer prepare ILD 302 with coating 501 to be patterned for the trench feature etch. ARC 601 is common in the art and enables clean, high aspect ratio (as high as 5:1 depth:width) etched features by attenuating reflections that create notched surfaces on the vertical walls of the etched feature.

The ARC 601 material can be any of a variety of glasses containing organic dyes as is well known in the art. The organic dyes are optically absorbent to facilitate the reflection attenuation as noted above. In general, the ARC 601 chemistry is similar (and in an embodiment almost identical) to the ILD 302 chemistry. The similar chemistry between the ARC 601 and ILD 302 materials facilitates the trench feature etch, as the trench feature etch (further detailed with reference to FIG. 7) must remove both materials at approximately the same rate. If the chemistry of the ARC 601 material were substantially dissimilar to the chemistry of the ILD 302 material, the bottom of the trench feature may not be flat as the ARC 601 and ILD 302 materials will be removed at different rates.

Figure 7:
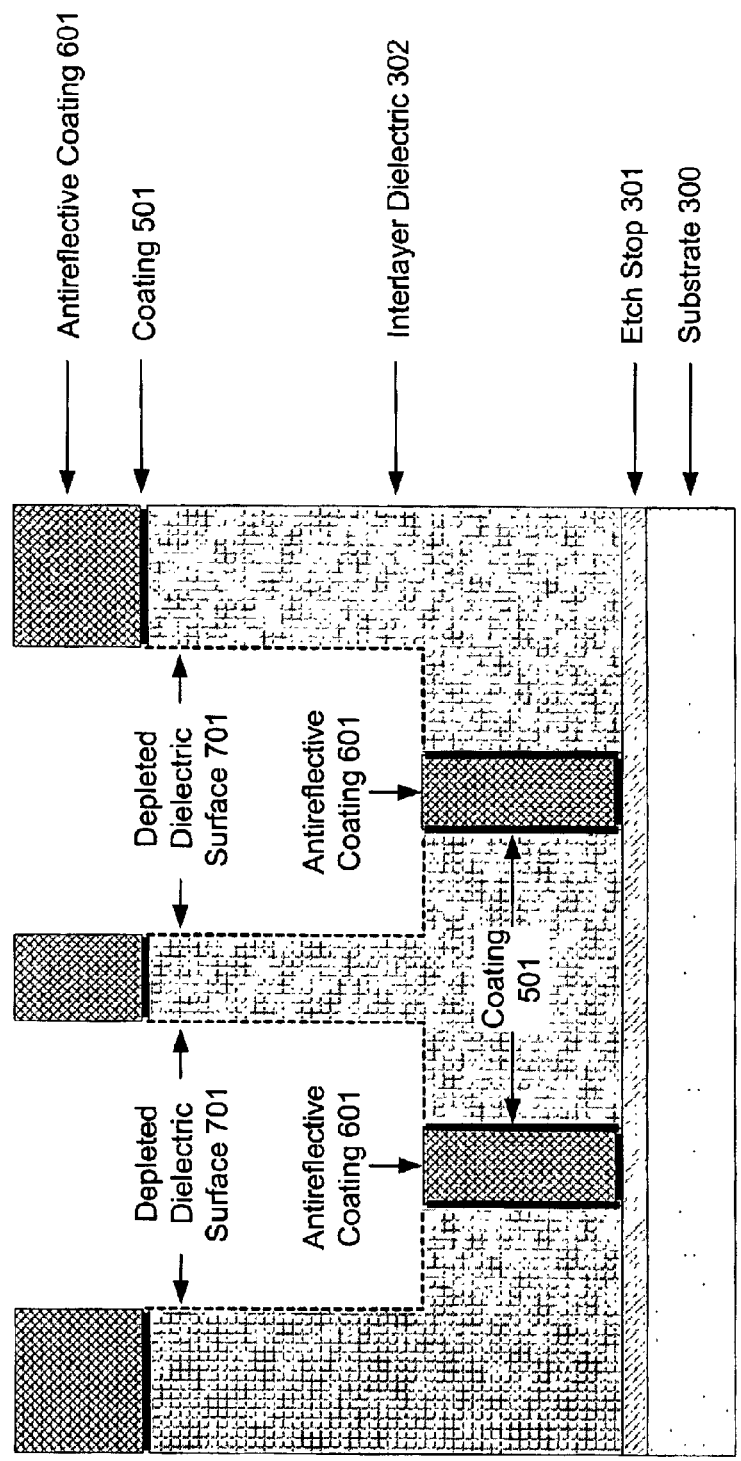
FIG. 7: illustration of substrate cross-section following trench etch and photoresist removal.

FIG. 7 illustrates a cross section of substrate 300 utilizing a via-first, copper dual-damascene process following the processes illustrated by FIG. 6, after the trench etch, and after photoresist 602 removal. Like the via feature etch, the trench feature etch is performed using plasma etching techniques as is well known in the art. The plasma etch has removed portions of ILD 302 to create the trench feature, with the resulting etched ILD 302 surfaces being damaged (by the plasma removing surface organic groups) as discussed with reference to the initial via feature etch as illustrated by FIG. 4, and as illustrated by a depleted dielectric surface 701. Exposed surfaces of ILD 302 are further damaged by plasma ashing and priming steps used to prepare photoresist 602 and ARC 601, respectively, for removal by the same mechanism discussed with reference to the plasma via feature etch.

Figure 8:
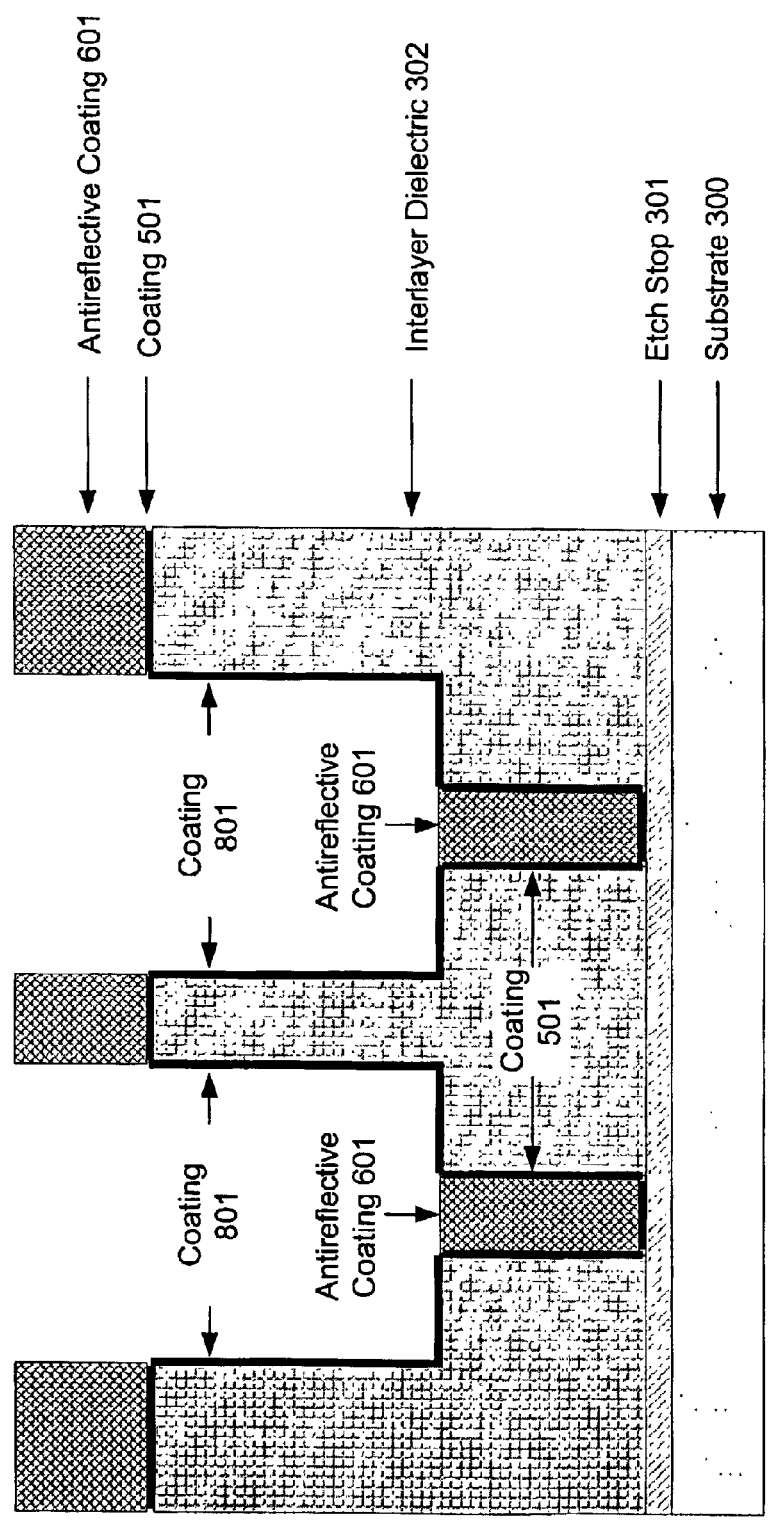
FIG. 8: illustration of substrate cross-section following the repair and passivation of the low-k interlayer dielectric exposed during the trench etch by surface organic group replenishment.

FIG. 8 illustrates a cross section of substrate 300 utilizing a via-first, copper dual-damascene process following the processes illustrated by FIG. 7, after the surfaces of ILD 302 exposed during the trench etch have had their surface organic groups replenished and surfaces passivated. In an embodiment, the surface organic group replenishment and passivation of the invention only effect ILD 302. In other words, the exposed surfaces of ARC 601 do not become as hydrophobic as the surfaces of ILD 302 such that the standard fluoride-based aqueous etch used to remove ARC 601 becomes ineffective. As noted, selective passivation based on novel selection of ARC material, ILD material, and silane coupling agent enables the selective etching necessary to create clean etch features, with intact critical dimensions, in systems that benefit from the use of low-k dielectric materials.

It is important to note that novel coatings 501 and 801 are created during different processing stages. While in an embodiment they are chemically identical, as each is a reaction product of the same ILD material exposed to the same silane coupling agent, one skilled in the art may recognize that the coatings do not necessarily have to be the same. In either case, it is important that each coating be formed to properly protect ILD 302. Coating 501, the formation of which necessarily occurs before ARC 601 material is deposited, is particularly important in protecting the walls of the via feature during ARC 601 removal, etch stop 301 removal, and subsequent via cleans that physically open the via to either substrate 300 or additional, previously deposited interconnect layers. Coating 801 repairs and protects the ILD 302 material exposed and damaged during the trench feature etch, and primarily protects the critical dimension separating adjacent trench features. The novel method of an embodiment of the invention includes forming not only a single coating, but also a combination of coatings.

The novel wet etch selectivity between the ARC 601 and porous ILD 302 is determined by both coating 501 and coating 801. The creation of coatings 501 and 801 is determined by the surface density and relative size of the organic groups present in the distinct ARC 303, ARC 601, and ILD 302 materials. The replenishing and passivating silylation/silanization reaction (e.g., exposure to a silane coupling agent) involves the reaction of ILD 302 surface Si—OH bonds to form Si—O—Si* bonds wherein the * indicates an attached hydrocarbon side-group. The ARC 302 and ARC 601 surfaces are comprised of bulky organic groups (e.g., aromatic or tertiary carbon species like isopropyl) that sterically hinder silanization because the bulky organic groups are impermeable to the reactive species of the silane coupling agent. Si—O—Si* bonds do not form on either the ARC 303 or ARC 601 surface. However, the bulky organic groups on the surface of ARC 303 and 601 are permeable to smaller fluoride ions (F—), such that the ARC 303 and ARC 601 can still be etched using fluoride-based aqueous chemistries. Examples of fluoride-based aqueous chemistries include HF, $NH_4F$, BOE and combinations thereof with other solvents or corrosives as is well known in the art. Conversely, the smaller organic groups (e.g., methyl or linear alkyl chains) comprising the ILD 302 surface readily facilitate the diffusion of silane coupling agents, enabling the ILD 302 surface to be passivated as represented by coatings 501 and 801. The result, through creative material selection for the ARC 303, ARC 601, ILD 302, and silane coupling agent, is a process wherein the ILD 302 surface is passivated and protected (e.g., a coating formed thereon) while wet etch chemistries readily attack and remove the ARC 601 material.

Figure 9:
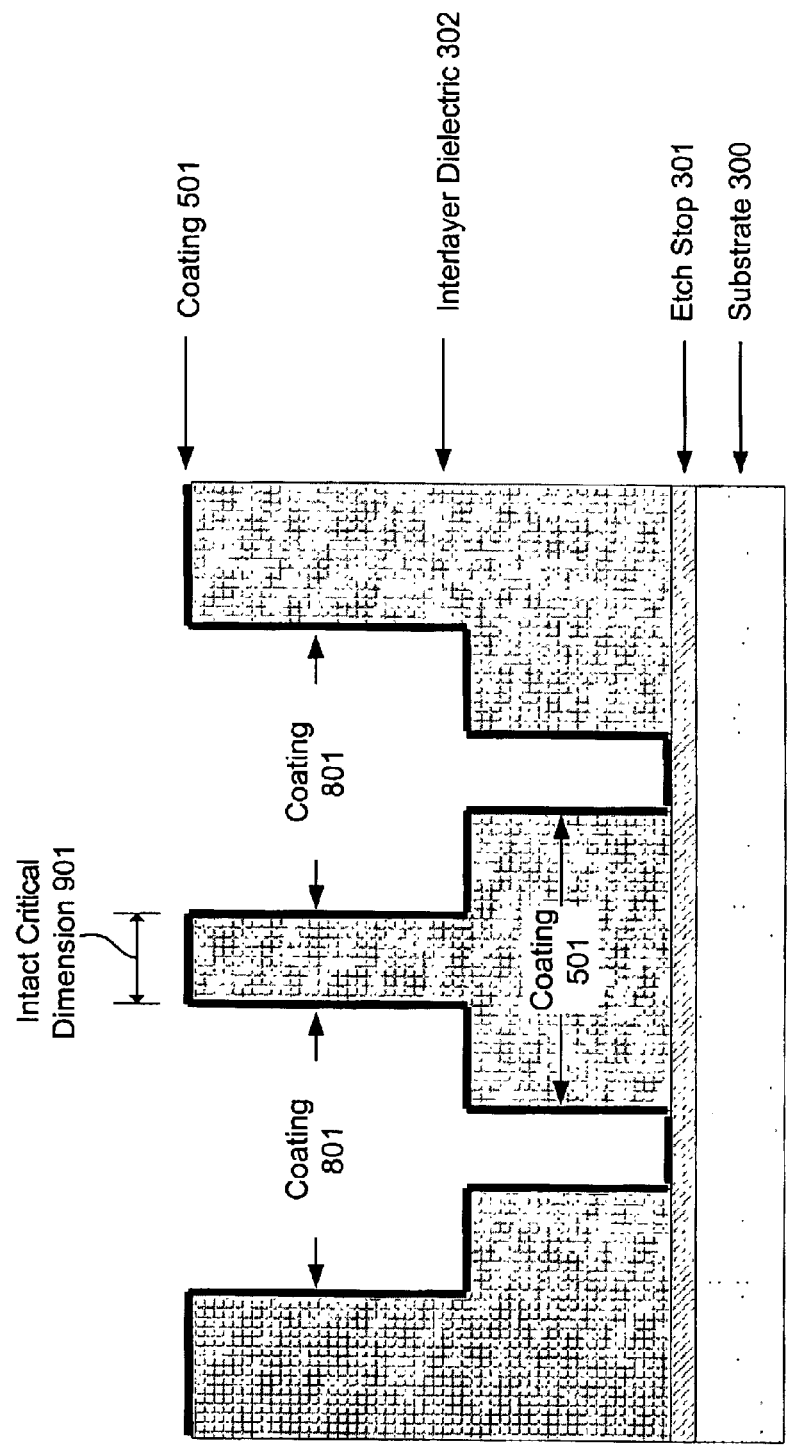
FIG. 9: illustration of a substrate cross-section with all exposed low-k interlayer dielectric surfaces repaired and passivated by surface organic group replenishment, following the removal of the anti-reflective coating, with an intact critical dimension.

FIG. 9 illustrates a cross section of substrate 300 utilizing a via-first, copper dual-damascene process following the processes illustrated by FIG. 8 and after ARC 601 removal using standard fluoride-based aqueous etch techniques as is well understood in the art. The remaining architecture, after removing etch stop 301 at the bottom of the via feature and appropriate cleaning steps, is ready for diffusion barrier and copper deposition as is well understood in the art. The noteworthy benefits of an embodiment of the invention are twofold. Exposure to a silane coupling agent has replenished an ILD 302 surface organic group, lowering the dielectric constant ILD 302 to that of pristine ILD 302 material. Coatings 501 and 801 formed by the replenishment have protected ILD 302 from the wet etch chemistries used to remove ARC 601. The resulting topography is dimensionally superior to and more physically and chemically sound than the topography created in absence of an embodiment of the invention as illustrated by intact critical dimension 901.

Figure 10:
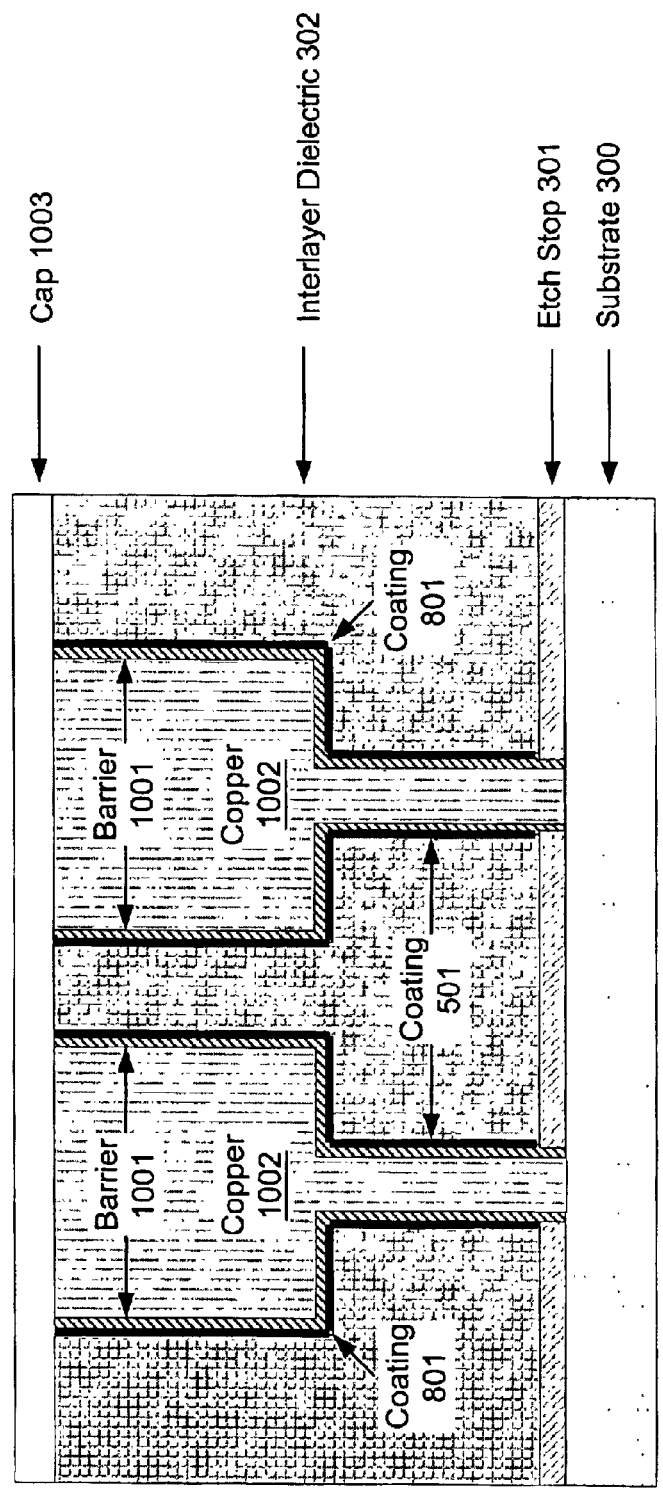
FIG. 10: illustration of substrate cross section following via clean, barrier level deposition, copper deposition, planarization, and cap deposition.

FIG. 10 illustrates a cross section of substrate 300 utilizing a via-first, copper dual-damascene process following the processes illustrated by FIG. 9 and after etch stop plasma etch (including removing the coating 501 from the surface of the etch stop, if present), barrier 1001 deposition, copper 1002 deposition, CMP planarization, and cap 1003 deposition. Once the deposited copper has been planarized and capped, an interconnect level in the copper dual-damascene process is complete. Cap 1003 can be a substrate for subsequent interconnect layers by repeating the preceding process steps. Cap 1003 can further serve as a final passivation should copper 1002 be the hierarchical top of an interconnect stack.

Figure 11:
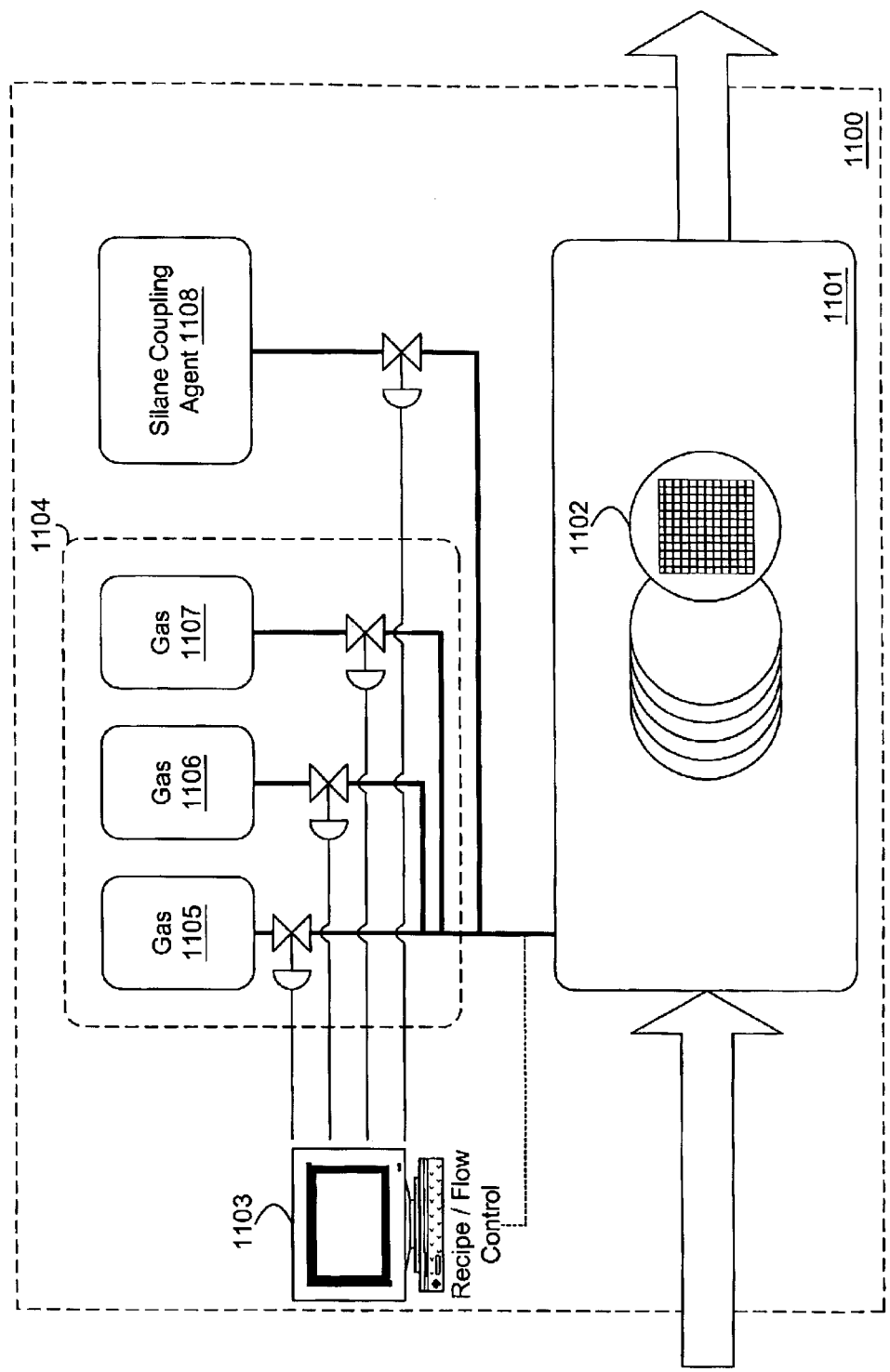
FIG. 11: system diagram of gaseous phase repair and passivation of silicon-containing low-k interlayer dielectric surfaces.

FIG. 11 illustrates a vapor exposure system 1100 (in which the vacuum and electrical sources have been omitted for simplicity) used to enact an embodiment of the invention through gaseous phase interactions. An exposure chamber 1101 houses wafers 1102 during exposure. Recipe/Flow Control 1103 controls the pressure and flow of the individual source gases to facilitate the silane coupling agent exposure. The temperature and/or pressure of the exposure chamber 1101 may be adjusted to maintain the vapor phase of the silane coupling agent. Source gases 1104, including individual gases 1105–1107, can be silane coupling agent constituents, inert carrier gases that do not participate in any chemical reaction (e.g., argon or helium), or combinations thereof. Alternatively or additionally, the silane coupling agent can be provided by a single source as illustrated by silane coupling agent 1108. It is well understood that the silane coupling agent 1108 can be any number of compounds depending on the desired replenishment of a surface organic group. The arrows entering and exiting the vapor exposure system 1100 further emphasize the in situ silane coupling agent deposition step (e.g., no external steps) and the simplicity with which wafer 1102 can be exposed to a silane coupling agent.

A wafer can also be exposed to a liquid silane coupling agent. Such an arrangement may include combining the silane coupling agent with any variety of basic organic solvents that would aid wafer and silane coupling agent interaction. A wafer could then be immersed in or otherwise exposed to the silane coupling agent solution. The liquid exposure may also be arranged in situ to avoid contamination and process flow interruptions potentially associated with an ex situ aqueous silane coupling agent exposure.

Figure 12:
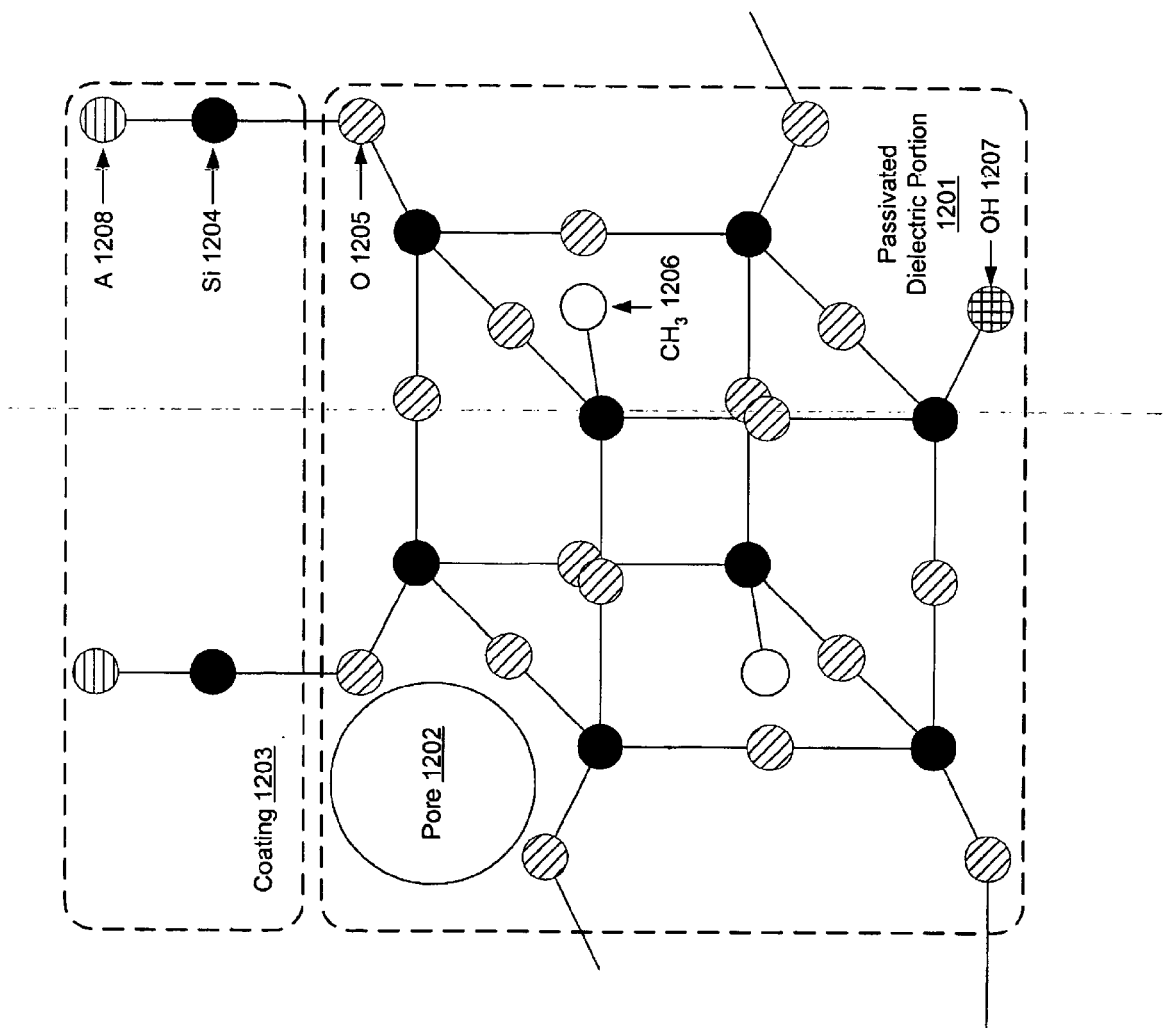
FIG. 12: molecular diagram of the amorphous replenished and passivated low-k interlayer dielectric material.

FIG. 12 illustrates a representative molecular portion of the amorphous passivated dielectric material. A passivated dielectric portion 1201, including a pore 1202, and coating 1203 are representative of the molecular composition of the replenished and passivated dielectric material surface. The passivated dielectric portion 1201 includes, as represented by their chemical or elemental composition, Si 1204, O 1205, $CH_3$ 1206, OH 1207 and A 1208 wherein A is an attached hydrocarbon side group specific to the silane coupling agent as characterized by the * in the Si—O—Si* bond. In general, each Si 1204 atom is bonded to four other atoms or molecules including but not limited to O 1205, $CH_3$ 1206, OH 1207, and A 1208. It is important to note that for illustrative simplicity only, FIG. 12 shows the passivated dielectric portion 1201 as being geometric and repeating. However, in reality the passivated dielectric portion 1201 is amorphous. The bonds are strained and the overall geometry is imperfect. In an embodiment, the coating 1203 is hydrophobic, the benefits of which have been described with reference to FIGS. 3–10.

As mentioned, the novel method of an embodiment of the invention passivates the surface of an interlayer dielectric and replenishes its surface organic groups through the same chemical reaction. However, the novel embodiment selectively passivates making the exposed interlayer dielectric hydrophobic while not interfering with the relative hydrophilic nature of the adjacent antireflective coating. Standard wet etch techniques, given the relative difference in surface energies of coated interlayer dielectric material and antireflective coating material, are highly selective. The result is a copper dual-damascene architecture, with properly intact critical dimensions, that utilizes a sufficiently low-k interlayer dielectric.

One skilled in the art will recognize the elegance of the disclosed embodiment in that it helps solve factors limiting the production use of leading-edge low-k dielectric materials, particularly porous silicon-containing dielectric materials, without adding ex situ steps or other complex manufacturing steps. The two benefits offered by an embodiment of the invention (e.g., porous, silicon-containing ILD surface carbon replenishment and passivation to make the surface more hydrophobic) can be completed in a single processing step, and can be easily duplicated for additional plasma etch steps and increasing numbers of interconnect levels.

What is claimed is:

1. A method comprising:

forming a layer of dielectric material;

forming a layer of antireflective coating on the layer of dielectric material;

etching, through the layer of antireflective coating, a via feature in the dielectric material, etching the via feature in the dielectric material depleting a surface organic group of the dielectric material;

exposing the dielectric material and the antireflective coating to a silane coupling agent;

replenishing the surface organic group of the dielectric material;

forming, as a result of the replenishing, a hydrophobic coating on the dielectric material wherein the hydrophobic coating substantially does not form on the antireflective coating; and removing the layer of antireflective coating wherein the hydrophobic coating on the dielectric material protects the dielectric material during the antireflective coating removal.

2. The method of claim 1 further comprising:

forming a second layer of antireflective coating on the layer of dielectric material wherein the second layer of antireflective coating fills the via feature in the dielectric material;

etching, through the second layer of antireflective coating, a trench feature in the dielectric material, etching the trench feature in the dielectric material depleting the surface organic group of the dielectric material;

exposing the dielectric material and the second layer of antireflective coating to the silane coupling agent;

replenishing the surface organic group of the dielectric material;

forming, as a result of the replenishing, a second hydrophobic coating on the dielectric material wherein the second hydrophobic coating substantially does not form on the second layer of antireflective coating; and removing the second layer of antireflective coating, the hydrophobic coating and the second hydrophobic coating on the dielectric material protecting the dielectric material during the antireflective coating removal.

3. The method of claim 2 wherein the silane coupling agent replenishing the surface organic group of the dielectric material lowers the dielectric constant of the dielectric material.

4. The method of claim 3 wherein the dielectric material is a porous, silicon-containing, organic material.

5. The method of claim 4 wherein the porous, silicon-containing organic material is a low dielectric constant interlayer dielectric in a copper dual-damascene architecture.

6. The method of claim 5 wherein the porous, silicon-containing, organic material is selected from the group consisting of hydrosilesquioxane and methylsilesquioxane.

7. The method of claim 3 wherein the silane coupling agent is selected from the group consisting of disilazane, trichiorosilane, trimethoxy silane, triethoxy silane, silanol, siloxane, disiloxane, n-dodecyltrichlorosilane, and octyltrichlorosilane, hexamethyldisilazane, and 3-aminopropyltriethoxysilane.

8. The method of claim 7 wherein the surface organic group of the dielectric material is carbon.

9. The method of claim 7 wherein the silane coupling agent is gaseous phase.

10. The method of claim 7 wherein the silane coupling agent is liquid phase.

11. The method of claim 2, removing the layer and second layer of antireflective coating further comprising exposing each layer of antireflective coating to an aqueous etch chemistry.

12. The method of claim 11 wherein the aqueous etch chemistry is selected from the group consisting of HF, $NH_4F$, and BOE.

13. A method comprising:

forming an antireflective coating on a dielectric material;

etching the dielectric material and the antireflective coating;

exposing the dielectric material and the antireflective coating to a silane coupling agent;

selectively passivating the dielectric material wherein the antireflective coating is substantially not passivated by the silane coupling agent exposure.

14. The method of claim 13, selectively passivating the dielectric material further comprising:

replenishing a surface organic group of the dielectric material.

15. The method of claim 13, selectively passivating the dielectric material further comprising:

forming a hydrophobic surface on the dielectric material.

16. The method of claim 13 further comprising:

selectively removing the antireflective coating with a wet etch wherein the dielectric material is substantially undamaged by the wet etch.

17. The method of claim 13 wherein the silane coupling agent is selected from the group consisting of disilazane, trichiorosilane, trimethoxy silane, triethoxy silane, silanol, siloxane, disiloxane, n-dodecyltrichlorosilane, and octyltrichiorosilane, hexamethyldisilazane, and 3-aminopropyltriethoxysilane.

* * * * *